(12) United States Patent
Toguchi et al.

(10) Patent No.: US 8,101,948 B2
(45) Date of Patent: Jan. 24, 2012

(54) SWITCHING ELEMENT (75) Inventors: Satoru Toguchi, Minato-ku (JP);
Hiroyuki Endoh, Minato-ku (JP)

(73) Assignee: NEC Corporation, Tokyo (JP)

( * ) Notice: Subject to any disclaimer, the term of this patent is extended or adjusted under 35 U.S.C. 154(b) by 99 days.

(21) Appl. No.: 12/665,252

(22) PCT Filed: Feb. 19, 2008

(86) PCT No.: PCT/JP2008/052687
§ 371 (c)(1),
(2), (4) Date: Dec. 17, 2009

(87) PCT Pub. No.: WO2008/155930
PCT Pub. Date: Dec. 24, 2008

(65) Prior Publication Data
US 2010/0200838 A1     Aug. 12, 2010

(30) Foreign Application Priority Data
Jun. 20, 2007   (JP) .................. 2007-162416

(51) Int. Cl.
*H01L 29/10* (2006.01)
(52) U.S. Cl. ..... 257/57; 257/66; 257/192; 257/E27.029; 977/708; 977/742
(58) Field of Classification Search .............. None
See application file for complete search history.

(56) References Cited

U.S. PATENT DOCUMENTS
2006/0240605 A1   10/2006   Moon et al.

FOREIGN PATENT DOCUMENTS

| JP | 2005-026698 A | 1/2005 |
|----|---------------|--------|
| JP | 2005-150410 A | 6/2005 |
| JP | 2005-175386 A | 6/2005 |
| JP | 2006-073774 A | 3/2006 |
| JP | 2006-303507 A | 11/2006 |
| JP | 2007-012986 A | 1/2007 |
| WO | 2007/026608 A1 | 3/2007 |

OTHER PUBLICATIONS

E. Artukovic, et al., "Transparent and Flexible Carbon Nanotube Transistors", Nano Letters, 2005, pp. 757-760, vol. 5, No. 4.*
Wikipedia—Parylene. May 13, 2011. http://en.wikipedia.org/wiki/Parylene.*

(Continued)

*Primary Examiner* — Evan Pert
*Assistant Examiner* — Scott R Wilson
(74) *Attorney, Agent, or Firm* — Sughrue Mion, PLLC (57) ABSTRACT

In a switching element using, for the active layer, a carbon nanotube (CNT) dispersed film which can be manufactured at low temperatures, the interaction between the CNT and the surface of the gate insulating film is insufficient. For this reason, a problem of such a switching element is that the amount of CNT fixed in the channel region is insufficient, resulting in insufficient uniformity. In the switching element of the exemplary embodiment, a gate insulating film is formed of a nonconjugated polymer material containing, in the main chain, an aromatic group and a substituted or unsubstituted alkylene or alkyleneoxy group having 2 or more carbon atoms as repeating units. As a result, the interaction between the CNT and the surface of the gate insulating film is enhanced while maintaining the flexibility of the gate insulating film, and the amount of CNT fixed in the channel region can be increased. Thereby, a switching element having good and stable transistor characteristics can be obtained by a low-temperature, simple, and inexpensive process.

7 Claims, 2 Drawing Sheets

OTHER PUBLICATIONS

E. S. Snow, et al., "Random networks of carbon nanotubes as an electronic material", Applied Physics Letters, Mar. 31, 2003, pp. 2145-2147, vol. 82, No. 13.

Seung-Hyun Hur, et al., "Extreme bendability of single-walled carbon nanotube networks transferred from high-temperature growth substrates to plastic and their use in thin-film transistors", Applied Physics Letters, 2005, pp. 243502-1 to 243502-3, vol. 86.

Taishi Takenobu, et al., "High-performance transparent flexible transistors using carbon nanotube films", Applied Physics Letters, 2006, pp. 033511-1 to 033511-3, vol. 88.

* cited by examiner

SWITCHING ELEMENT

TECHNICAL FIELD

The exemplary embodiment relates to a switching element in which a carbon nanotube (hereinafter referred to as a CNT) is used for an active layer.

BACKGROUND ART

Thin film transistors (hereinafter referred to as TFTs) have been widely used as pixel switching elements for a display unit such as a liquid crystal display and an EL display. In recent years, pixel array driver circuits have also been increasingly formed on the same substrate by the use of TFTs. Such TFTs have conventionally been prepared on a glass substrate using amorphous or polycrystalline silicon. However, unfortunately, a CVD apparatus used for preparing a TFT using such silicon is very expensive, leading to a significant increase in manufacturing cost associated with producing a larger-area display unit using TFTs. Further, since a process for depositing amorphous or polycrystalline silicon is performed at an extremely high temperature, there are limits to materials which can be used as a substrate; specifically, a lightweight resin substrate or the like cannot be used.

As a means of solving the problem described above, a TFT using a CNT dispersed film as a semiconductor material has been proposed. The CNT dispersed film is generally formed by a wet process such as a coating process. The wet process can inexpensively realize enlargement of the area and requires a low process temperature. Therefore, an advantage of this process is that there are few limits to selecting a material used as a substrate. For this reason, practical utilization of TFTs using a CNT dispersed film is expected. Actually, TFTs using a CNT dispersed film have been extensively reported in recent years, for example, in the following Non-Patent Documents 1 to 4.

Non-Patent Document 1: E. S. Snow, J. P. Novak, P. M. Campbell, and D. Park, Applied Physics Letters, vol. 82, p. 2145, 2003

Non-Patent Document 2: E. Artukovic, M. Kaempgen, D. S. Hecht, S. Roth, and G. Gruener, Nano Letters, vol. 5, p. 757, 2005

Non-Patent Document 3: S. -H. Hur, O. O. Park, and J. A. Rogers, Applied Physics Letters, vol. 86, p. 243502, 2005

Non-Patent Document 4: T. Takenobua, T. Takahashi, T. Kanbara, K. Tsukagoshi, Y. Aoyagi, and Y. Iwasa, Applied Physics Letters, vol. 88, p. 33511, 2006

DISCLOSURE OF THE INVENTION

Problems to be Solved by the Invention

Figure 1:
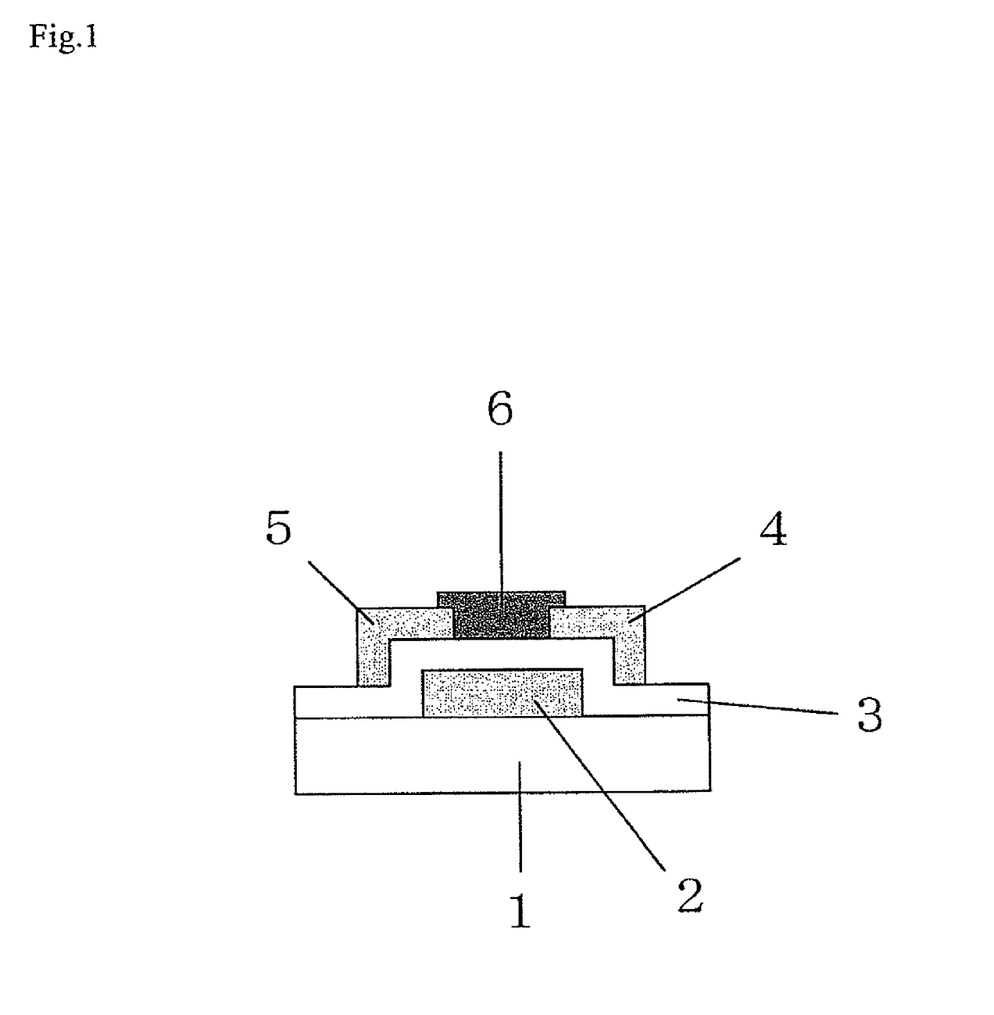
FIG. 1 is an example of a sectional view of the switching element of the exemplary embodiment.

In the case of a bottom contact structure having a gate electrode on a supporting substrate as shown in FIG. 1, a TFT using the CNT has an unsatisfactory interaction between a CNT in a dispersion and the surface of an insulating film in the manufacturing process. As a result, a problem of such a TFT is that the amount of CNT fixed in a channel region is insufficient, resulting in insufficient uniformity. Nonuniformity of the amount of the adhered CNT in the channel region causes variation in the switching characteristics of the element and significantly reduces the yield when the element is arrayed. As a means of solving this problem, the channel region has been surface-treated by an aromatic thiol such as mercaptopyridine to fix the CNT at a high density. However, it is known that this complicates the manufacturing process, for example, because an additional surface treatment step is required and a patterning step is further required for suppressing the attachment to places other than the channel, causing an increase in cost.

Figure 2:
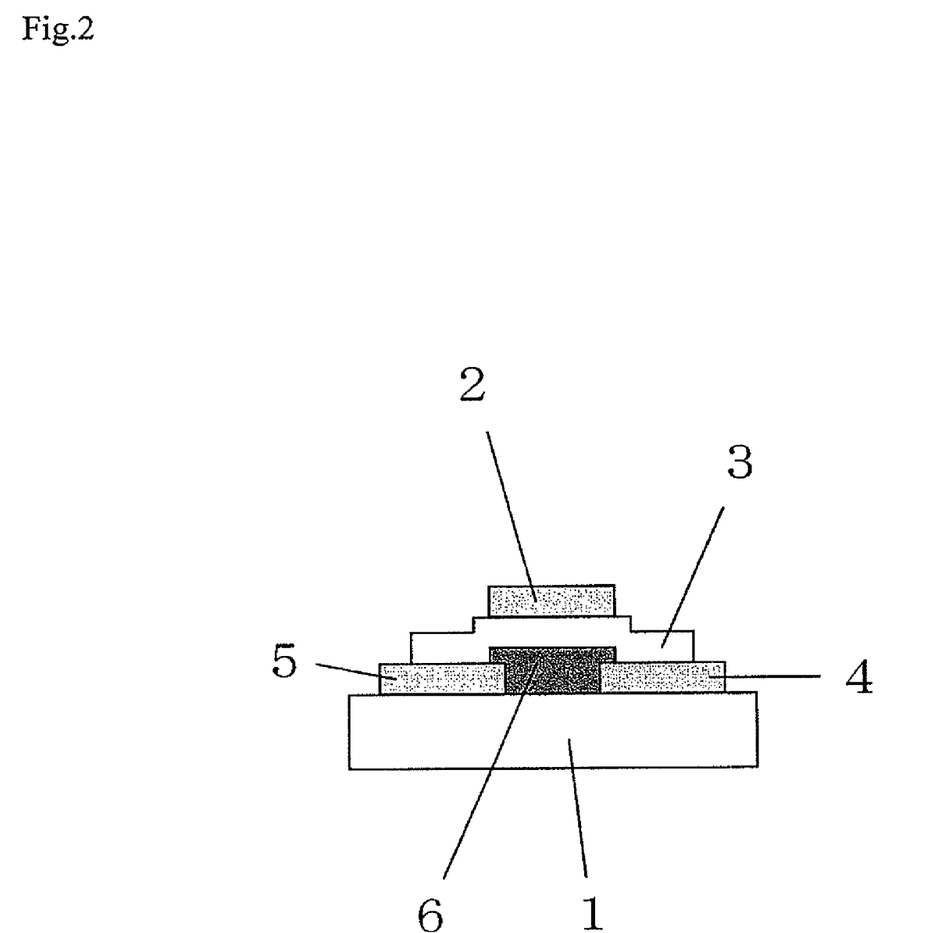
FIG. 2 is another example of a sectional view of the switching element of the exemplary embodiment.

On the other hand, in the top contact structure in which a gate electrode is present on the opposite side to a supporting substrate across an active layer as shown in FIG. 2, an insufficient interaction between the CNT and the gate insulating film causes the instability of the interface between the active layer and the gate insulating film. Therefore, the insufficient interaction is a factor which causes a change with time in element characteristics.

An object of the exemplary embodiment is to provide a switching element having good and stable transistor characteristics by a low-temperature, simple, and inexpensive process using a CNT dispersed film.

Means for Solving the Problems

As a result of extensive studies to solve the above-described problems, the present inventors have found a gate insulating film formed of a nonconjugated polymer containing in the main chain an aromatic ring and a substituted or unsubstituted alkylene or alkeyleneoxy group having 2 or more carbon atoms as repeating units. Thereby, the interaction between the surface of the gate insulating film and the CNT has been able to be enhanced, and a switching element having good and stable transistor characteristics has been obtained by a low-temperature, simple, and inexpensive process.

Specifically, the exemplary embodiment provides a switching element comprising, on a supporting substrate, a source electrode and a drain electrode separated from each other, an active layer in contact with both of the electrodes, and a gate electrode separated from the two types of electrodes and in contact with the active layer via a gate insulating film, characterized in that the active layer is formed of a carbon nanotube dispersed film, and the gate insulating film contains a layer formed of a nonconjugated polymer comprising a main chain represented by general formula [1]. In the formula, Ar represents an aromatic group; X represents a linking group selected from a single bond, an oxygen atom, an ester bond, and an amide bond; A represents a substituted or unsubstituted alkylene or alkyleneoxy group having 2 to 8 carbon atoms; and n represents a positive integer.

[Formula 1]

$$\pm Ar\!-\!X\!-\!A\pm_n \qquad [1]$$

The exemplary embodiment is characterized in that the carbon nanotube dispersed film is a film formed by applying a dispersion in which a carbon nanotube is dispersed in a liquid dispersion medium and then removing the dispersion medium.

The exemplary embodiment is characterized in that the gate insulating film has a thickness of from 0.01 to 1 μm.

The exemplary embodiment is characterized in that the gate insulating film is a film formed by applying a solution of the nonconjugated polymer material and then removing a solvent.

The exemplary embodiment is characterized in that the gate insulating film is a single layer film comprising the nonconjugated polymer material.

The exemplary embodiment is characterized in that the gate insulating film is a laminated film of a first gate insulating film comprising at least the nonconjugated polymer material and in contact with the active layer and a second gate insulating film formed of a material different from the material of the first gate insulating film.

The exemplary embodiment is characterized in that Ar of the nonconjugated polymer represented by the general formula [1] is an aromatic carbon ring.

Advantages of the Invention

The exemplary embodiment can provide a switching element having good and stable transistor characteristics by a low-temperature, simple, and inexpensive process using a CNT dispersed film.

DESCRIPTION OF SYMBOLS

1 . . . Supporting substrate
2 . . . Gate electrode
3 . . . Gate insulating film
4 . . . Source electrode
5 . . . Drain electrode
6 . . . Active layer (CNT dispersed film)

BEST MODE FOR CARRYING OUT THE INVENTION

[Description of Constitution]

Hereinafter, the constitution of the switching element of the exemplary embodiment will be described.

An example of the structure of the switching element of the exemplary embodiment is shown in FIG. 1. A gate insulating film 3 is formed so as to be in contact with a gate electrode 2 formed on a supporting substrate 1. A source electrode 4 and a drain electrode 5 separated to each other by a distance according to a channel length are arranged on the gate insulating film 3. A CNT dispersed film is arranged as an active layer 6 so that it is in contact with all of the gate insulating film 3, the source electrode 4, and the drain electrode 5 to obtain a CNTTFT switching element.

Another example of the structure of the switching element of the exemplary embodiment is shown in FIG. 2. A source electrode 4 and a drain electrode 5 separated to each other by a distance according to a channel length are arranged on a supporting substrate 1. A CNT dispersed film is formed as an active layer 6 so that it is in contact with the electrodes. A gate insulating film 3 is formed on the electrodes and the dispersed film, and a gate electrode 2 is formed on the gate insulating film 3 to obtain a CNTTFT switching element.

The gate insulating film 3 is formed of a nonconjugated polymer represented by general formula [1] containing, in the main chain, an aromatic group and a substituted or unsubstituted alkylene or alkyleneoxy group having 2 or more carbon atoms as repeating units. The aromatic group contained in the main chain is exposed to the surface of the film with a specific probability when the thin film is formed. The attraction due to the interaction between the π-electron cloud which the aromatic group has and the π-electron cloud exposed to the CNT surface tightly fix the CNT to the surface of the gate insulating film, realizing the enhancement of the interaction between the active layer comprising the CNT dispersed film and the gate insulating film, which is an object of the exemplary embodiment. However, the main chain having a conjugated structure causes increase in the electric conductivity of the entire polymer film, thereby making it impossible to sufficiently achieve the original function of a gate insulating film to suppress the leak current between a gate electrode and other electrodes. For this reason, the main chain skeleton needs to have a nonconjugated structure. Further, when the main chain skeleton having an aromatic group does not contain a substituted or unsubstituted alkylene or alkyleneoxy group having 2 or more carbon atoms as repeating units, a structural freedom of the main chain will be reduced, thereby reducing the film elasticity to result in a rigid film. This makes it difficult to apply a flexible substrate material, resulting in a significant reduction in the degree of freedom to select a supporting substrate. It may be possible to avoid the above-described problem by introducing a side chain such as a long chain alkyl group having 9 or more carbon atoms to enlarge the distance between the main chains to soften the film. However, since such a structure will significantly reduce the number of aromatic groups exposed to the surface of the gate insulating film, the enhancing effect of the interaction between the active layer comprising the CNT dispersed film and the surface of the gate insulating film, which is the original object, will not be obtained. For the above reasons, the gate insulating film 3 according to the exemplary embodiment is formed, as mentioned above, of a nonconjugated polymer represented by general formula [1] containing, in the main chain, an aromatic group and a substituted or unsubstituted alkylene or alkyleneoxy group having 2 or more carbon atoms as repeating units.

[Formula 2]

[1]

The gate insulating film 3 is desirably a single layer film comprising the nonconjugated polymer material from the viewpoint of process simplification. However, in the applications requiring reduction in the voltage to drive the switching element, the gate insulating film 3 may be formed of a laminated structure with a second gate insulating film of a high dielectric constant material such as titanium oxide and tungstic oxide. In this case, however, the first gate insulating film comprising the nonconjugated polymer needs to be arranged in the position in contact with the active layer 6.

Further, the thickness of the gate insulating film 3 is not particularly limited. However, when it is too small, it will be difficult to effectively suppress the leak current between the gate electrode and other electrodes. On the other hand, when it is too large, it will be impossible to effectively control the switching phenomenon of the active layer by gate bias voltage. Therefore, the thickness is preferably in the range of from 0.01 to 1 μm.

The constitution as described above allows a switching element having good and stable characteristics to be manufactured by a low-temperature, simple, and inexpensive process, in a switching element using the CNT dispersed film for the active layer.

[Description of a Process]

As a supporting substrate used for the exemplary embodiment, any material can be used, if a switching element can be formed on it. Examples include not only inorganic materials such as glass, quartz, and a silicon wafer, but polymeric materials such as polyethylene-based resins such as polyethylene sulfide, polyethylene naphthalate, and polyethylene terephthalate, and polyamide-based and polycarbonate-based polymeric materials. However, the substrate is not particularly limited to these materials.

The CNT used for the active layer of the exemplary embodiment is not particularly limited as long as it shows semiconductor characteristics sufficient for the dispersed film. A method for producing the CNT is not particularly limited, and any CNT obtained by conventionally known production methods such as an arc discharge process, a laser ablation method, and a CVD method can be used. Two types of CNTs are originally known, a single-wall nanotube (SWNT) comprising a single carbon layer and a multi-wall nanotube (MWNT) comprising a plurality of carbon layers. There are an SWNT which shows semiconductor characteristics and that having metallic properties, and MWNT is formed by randomly combining them. The presence of a CNT showing metallic properties in a dispersed film may cause the increase in the OFF current. Therefore, in the applications where low power consumption is required, the ratio of the CNT showing metallic properties in the dispersed film is desirably as low as possible, but it is not particularly limited.

Examples of a technique for arranging the CNT in a channel region as a dispersed film include a wet process in which the CNT is dispersed in a liquid dispersion medium and then the resulting dispersion is applied or sprayed; and a dry process in which the disaggregated CNT is conveyed by a flow of a carrier gas and sprayed on the surface for arranging the CNT, but the technique is not particularly limited thereto. However, among these, a wet process is more preferable because the process is simpler and the loss of the CNT used is smaller than a dry process. Examples of the liquid dispersion medium for dispersing the CNT in a wet process include, but are not limited to, water and common organic solvents such as alcohols, ethers, esters, alkylamides, aliphatic hydrocarbons, and aromatic compounds. Any technique can be used as a dispersion method as long as it is a technique used in a common step of dispersing pigments or the like such as a kneading method such as agitation and milling and ultrasonic irradiation. Any suitable surfactant or binder may be added for promoting and keeping the dispersion. As a technique for applying or spraying the dispersion of the CNT, a film-forming method such as spin coating and blade coating, dropping by a dispenser, and a printing method such as an inkjet method can also be used.

A material used for the source, drain, and gate electrodes of the exemplary embodiment is not particularly limited as long as it is a material having sufficient electrical conductivity, but a material excellent in the charge injection characteristics into the CNT is more preferred for the electrode which acts as a charge injection electrode. Examples of the materials used for the electrodes include, but are not limited to, metal and alloy such as indium tin oxide alloy (ITO), tin oxide (NESA), gold, silver, platinum, copper, indium, aluminum, magnesium, magnesium-indium alloy, magnesium-aluminum alloy, aluminum-lithium alloy, and magnesium-silver alloy; an oxide thereof; and an organic material such as a conductive polymer.

The method for forming the source, drain, and gate electrodes of the switching element of the exemplary embodiment is not particularly limited. It is possible to use conventionally known general thin film-forming methods such as a vacuum deposition method, a spin coating method, a sputtering method, a CVD method, a coating method, and a coating and sintering method. A general photolithographic method, a printing method, and the like can be applied as a method for patterning the electrodes, but the patterning method is not particularly limited as long as it is a method in which a desired electrode pattern can be realized.

The nonconjugated polymer used for the gate insulating film of the exemplary embodiment has a nonconjugated structure in which the main chain contains an aromatic group and a substituted or unsubstituted alkylene or alkyleneoxy group having 2 or more carbon atoms, the repeating units thereof being represented by general formula [1].

[Formula 3]

[1]

In the formula, Ar represents an aromatic group; X represents a linking group selected from a single bond, an oxygen atom, an ester bond, and an amide bond; A represents a substituted or unsubstituted alkylene or alkyleneoxy group having 2 to 8 carbon atoms; and n represents a positive integer.

Examples of the aromatic group represented by Ar include an aromatic carbon ring group having 6 to 20 carbon atoms such as a phenylene group, a naphthylene group, an anthrylene group, a phenanthrylene group, a pyrenylene group, a tetracenylene group, a pentacenylene group, and a perylenylene group; and a substituted product thereof. The examples also include an aromatic heterocyclic group having 4 to 20 carbon atoms such as a pyrrolylene group, a thiophenylene group, a pyridinylene group, a pyrazinylene group, an indolylene group, an isoindolylene group, a furylene group, a benzofuranylene group, an isobenzofuranylene group, a quinolylene group, an isoquinolylene group, a quinoxalinylene group, a phenanthridinylene group, a phenoxazinylene group, and an oxazolylene group; and a substituted product thereof Examples of the substituent of the substituted product of the aromatic carbon ring group or the aromatic heterocyclic group include a methyl group, an ethyl group, halogen, a hydroxyl group, an amino group, and a mercapto group.

When the alkylene or alkyleneoxy group represented by A has 1 or less carbon atom, it will be difficult to provide sufficient flexibility to the resulting gate insulating film. On the other hand, when it has 9 or more carbon atoms, the distance between the aromatic groups will be excessively large, reducing the density of the aromatic groups exposed to the surface of the gate insulating film. As a result, sufficient interaction cannot be obtained between the surface of the gate insulating film and the active layer comprising the CNT dispersed film. Therefore, the alkylene or alkyleneoxy group represented by A needs to be selected from an alkylene or alkyleneoxy group having 2 to 8 carbon atoms. Further, the alkylene or alkyleneoxy group represented by A may have no substituent or may have a substituent as long as the group has a straight chain structure and 2 to 8 carbon atoms. However, a bulky substituent causing a steric hindrance effect decreases the structural degree of freedom of an alkyl chain, impairing the flexibility of the resulting gate insulating film. Therefore, when the alkylene or alkyleneoxy group has a substituent, the substituent is desirably an alkyl group having a small number of carbon atoms such as a methyl group and an ethyl group, a halogen atom, a hydroxyl group, or the like.

The technique for arranging the nonconjugated polymer material as a gate insulating film includes, but is not limited to, a method of vapor deposition followed by polymerization and a wet process such as printing and coating. However, the wet process is preferred in terms of process simplicity.

Examples of the material used for the second gate insulating film of the exemplary embodiment include widely used inorganic insulating materials such as $SiO_2$, $SiN_x$, and alumina and high dielectric constant materials such as titanium oxide, tungstic oxide, and tantalum oxide. Insulating polymers such as polyethylene naphthalate and polyethylene terephthalate can also be used. The technique for arranging the second gate insulating film includes, but is not limited to, a substantially the same technique as the technique for arranging the first insulating film. However, when the process for preparing the first insulating film is a wet process, each of the first and second insulating film materials needs to have suitable solvent resistance in order to form a laminated film. For this reason, a combination of the materials satisfying these requests is selected.

EXAMPLES

Example 1

FIG. 1 is a structural drawing of the switching element in Example 1 of the exemplary embodiment. Hereinafter, the steps for preparing the switching element will be described. Aluminum was deposited on a polyethylene naphthalate supporting substrate having a thickness of 0.5 mm through a shadow mask by a sputtering method to form a film having a thickness of 100 nm, thus obtaining the gate electrode 2. On the supporting substrate was formed a poly-p-xylylene film having a thickness of 180 nm as the gate insulating film 3 by a vapor deposition polymerization method using parylene as a raw material. On the gate insulating film 3, gold was deposited by a vacuum deposition method to form a film having a thickness of 60 nm, which was patterned by a lift-off method to obtain a source electrode 4 and a drain electrode 5. The electrode structure formed here has a channel width of 200 μm and a channel length of 50 μm. Further the resulting product was coated by a spin coating method with a dispersion prepared by adding an SWNT to a 0.01% aqueous solution of sodium dodecyl sulfonate and subjecting the resulting mixture to supersonic treatment for 1 hour to disperse the SWNT. The coating was then heated at 120° C. for 30 minutes to remove the solvent to form a CNT dispersed film which is the active layer 6, thus obtaining the switching element. Thirty pieces of the switching elements were prepared to measure the transistor characteristics of the obtained switching elements. The ON/OFF ratio (referred to as the ratio of the current between the source and drain electrodes with a source drain bias of −4 V at the ON-state gate voltage=−10 V to the current between the source and drain electrodes with a source drain bias of −4 at the OFF-state gate voltage=+10 V, hereinafter the same) was about $10^3$ for each of the switching elements, and the mode of the ON-state current values was 55±5 μA. Further, one element had an ON-state current value of 50% or less of this value.

Comparative Example 1

Thirty switching elements were prepared in the same manner as in Example 1 except that a sputtered film of $SiO_2$ having a thickness of 150 nm was used as a material for the gate insulating film 3. The obtained switching elements were measured for the transistor characteristics. It was found that 40% of the entire switching elements showed the switching characteristics. The ON/OFF ratio of the elements having the switching characteristics was about $10^3$. The mode of the ON-state current values was 8±1 μA, and 3 elements had an ON-state current value of 50% or less of this value.

Comparative Example 2

Thirty switching elements were prepared in the same manner as in Comparative Example 1 except that the step of coating with the CNT dispersion by a spin coating method in forming the active layer 6 was repeated 5 times for the purpose of increasing the amount of the CNT in the active layer. The obtained switching elements were measured for the transistor characteristics. It was found that 90% of the entire switching elements showed the switching characteristic. The ON/OFF ratio of the elements having the switching characteristics was about $10^3$. The mode of the ON-state current values was 40±4 μA, and 2 elements had an ON-state current value of 50% or less of this value.

Comparative Example 3

Thirty switching elements were prepared in the same manner as in Example 1 except that there was used a polypropylene film having a thickness of 200 nm as a material for the gate insulating film 3, the polypropylene film being prepared by coating with a solution of polypropylene in xylene by a spin coating method and then drying the coating at 120° C. The obtained switching elements were measured for the transistor characteristics. It was found that 53% of the entire switching elements showed the switching characteristics. The ON/OFF ratio of the elements having the switching characteristics was about $10^3$. The mode of the ON-state current values was 9±1 μA and 3 elements had an ON-state current value of 50% or less of this value.

Example 2

FIG. 2 is a structural drawing of the switching element in Example 2 of the exemplary embodiment. Hereinafter, the steps for preparing the switching element will be described. On a polyethylene naphthalate supporting substrate having a thickness of 0.5 mm, gold was deposited by a vacuum deposition method to faun a film having a thickness of 60 nm, which was patterned by a liftoff method to obtain the source electrode 4 and the drain electrode 5. The electrode structure formed here has a channel width of 100 μm and a channel length of 50 μm. The resulting product was coated by a dispensing method with a CNT dispersion prepared by ultrasonically treating an SWNT in dichloroethane for 1 hour. The coating was then heated at 100° C. for 10 minutes to remove the solvent to prepare a CNT dispersed film which is the active layer 6. Further thereon was formed a poly-p-xylylene film having a thickness of 250 nm by a vapor deposition polymerization method using parylene as a raw material to obtain the gate insulating film 3. Thereon was deposited aluminum by a vacuum deposition method through a shadow mask to form a film having a thickness of 100 nm as the gate electrode 2, thus obtaining the switching element. The transistor characteristics of the switching element obtained as described above were measured. It was found that the ON/OFF ratio was about $8.4 \times 10^2$ and the ON-state current value was 15 μA. In order to observe a change with time in the element characteristics, this element was allowed to stand in dry air for 20 days and then measured for the characteristics thereof again. The ON/OFF ratio was $8.2 \times 10^2$ and the ON-state current value was 13 μA.

Comparative Example 4

A switching element was prepared in the same manner as in Example 2 except that polypropylene was used as a material for the gate insulating film 3. When the transistor characteristics of the obtained switching element were measured, the ON/OFF ratio was $7.5 \times 10^2$ and the ON-state current value was 14 µA. These characteristics were measured again after allowing this element to stand for 20 days in dry air. It was found that the ON/OFF ratio was $2.7 \times 10^2$ and the ON-state current value was 10 µA.

Example 3

As a material to form the gate insulating film 3, a solution of a poly-3-(4-aminophenyl)propionic acid synthesized from 3-(4-aminophenyl)propionic acid in propylene glycol monomethyl ether acetate was applied by a spin coating method. Thirty switching elements were prepared in the same manner as in Example 1 except that the above coating was formed into a film having a thickness of 180 nm. The transistor characteristics of the obtained switching elements were measured. It was found that the ON/OFF ratio was about $10^3$ and the mode of the ON-state current value was 48±7 µA. No element had an ON-state current value of 50% or less of this value.

Example 4

As a material to form the gate insulating film 3, a solution of the poly-3-(4-aminophenyl)propionic acid mentioned above in propylene glycol monomethyl ether acetate was applied by a spin coating method. A switching element was prepared in the same manner as in Example 2 except that the above coating was formed into a film having a thickness of 180 nm. The transistor characteristics of the switching element obtained as described above were measured. It was found that the ON/OFF ratio was about $8.0 \times 10^2$, and the ON-state current value was 21 µA. These characteristics were measured again after allowing this element to stand for 20 days in dry air. It was found that the ON/OFF ratio was $7.8 \times 10^2$ and the ON-state current value was 17 µA.

Example 5

As a material to form the gate insulating film 3, a solution of a poly-4-(2-hydroxyethyl)benzoic acid synthesized from 4-(2-hydroxyethyl)benzoic acid in propylene glycol monomethyl ether acetate was applied by a spin coating method. Thirty switching elements were prepared in the same manner as in Example 1 except that the above coating was formed into a film having a thickness of 180 nm. The transistor characteristics of the obtained switching elements were measured. It was found that the ON/OFF ratio was about $10^3$ and the mode of the ON-state current value was 52±10 µA. One element had an ON-state current value of 50% or less of this value.

Example 6

As a material to form the gate insulating film 3, a solution of the poly-4-(2-hydroxyethyl)benzoic acid mentioned above in propylene glycol monomethyl ether acetate was applied by a spin coating method. A switching element was prepared in the same manner as in Example 2 except that the above coating was formed into a film having a thickness of 180 nm. The transistor characteristics of the switching element obtained as described above were measured. It was found that the ON/OFF ratio was about $7.2 \times 10^2$ and the ON-state current value was 16 µA. These characteristics were measured again after allowing this element to stand for 20 days in dry air. It was found that the ON/OFF ratio was $7.0 \times 10^2$ and the ON-state current value was 10 µA.

Example 7

In forming the gate insulating film 3, a tantalum oxide film having a thickness of 70 nm was formed by a sputtering method on the supporting substrate on which the gate electrode 2 was formed, thus obtaining a second insulating film. Then, thirty switching elements were prepared in the same manner as in Example 1 except that a poly-p-xylylene was deposited to form a film having a thickness of 100 nm by a vapor deposition polymerization method to obtain a first insulating film. The transistor characteristics of the obtained switching elements were measured. It was found that the ON/OFF ratio was about $8 \times 10^3$ and the mode of the ON-state current values was 180±18 µA. No element had an ON-state current value of 50% or less of this value.

Example 8

In forming the gate insulating film 3, the poly-p-xylylene mentioned above was deposited to form a film having a thickness of 100 nm by a vapor deposition polymerization method to obtain a first insulating film. Then, a switching element was prepared in the same manner as in Example 2 except that a tantalum oxide film having a thickness of 50 nm was formed by a sputtering method, thus obtaining a second insulating film. The transistor characteristics of the obtained switching element were measured. It was found that the ON/OFF ratio was about $8.7 \times 10^3$ and the ON-state current value was 21 µA. These characteristics were measured again after allowing this element to stand for 20 days in dry air. It was found that the ON/OFF ratio was $8.6 \times 10^3$ and the ON-state current value was 20 µA.

Example 9

As a material to form the gate insulating film 3, a solution of a poly[oxy(2-hydroxypropane-1,3-diyl)oxy-1,4-phenylene] synthesized from 2-(chloromethyl)oxirane and hydroquinone in propylene glycol monomethyl ether acetate was applied by a spin coating method. Thirty switching elements were prepared in the same manner as in Example 1 except that the above coating was formed into a film having a thickness of 180 nm. The transistor characteristics of the obtained switching elements were measured. It was found that the ON/OFF ratio was about $10^3$ and the mode of the ON-state current values was 52±10 µA. One element had an ON-state current value of 50% or less of this value.

Example 10

As a material to form the gate insulating film 3, a solution of the poly[oxy(2-hydroxypropane-1,3-diyl)oxy-1,4-phenylene] mentioned above in propylene glycol monomethyl ether acetate was applied by a spin coating method. A switching element was prepared in the same manner as in Example 2 except that the above coating was formed into a film having a thickness of 180 nm. The transistor characteristics of the switching element obtained as described above were measured. It was found that the ON/OFF ratio was about $7.2 \times 10^2$ and the ON-state current value was 16 µA. These characteristics were measured again after allowing this element to stand for 20 days in dry air. It was found that the ON/OFF ratio was $7.0 \times 10^2$ and the ON-state current value was 10 µA.

The evaluation results in the above Examples and Comparative Examples are shown in Table 1.

TABLE 1

| | Switching element structure | Gate insulating film 3 (first insulating film) | | Second insulating film | | Active layer 6 | | |
|---|---|---|---|---|---|---|---|---|
| | | Thickness (nm) | Material | Thickness (nm) | Material | Coating method | Number of coatings | Material |
| Ex. 1 | 1 | 180 | Poly-p-xylene | — | — | Spin coating method | 1 | SNWT |
| Ex. 2 | 2 | 250 | Poly-p-xylylene | — | — | Dispensing method | 1 | |
| Ex. 3 | 1 | 180 | Poly-3-(4-aminophenyl)propionic acid | — | — | Spin coating method | 1 | |
| Ex. 4 | 2 | 180 | Poly-3-(4-aminophenyl)propionic acid | — | — | Dispensing method | 1 | |
| Ex. 5 | 1 | 180 | Poly-3-(2-hydroxyethyl)benzoic acid | — | — | Spin coating method | 1 | |
| Ex. 6 | 2 | 180 | Poly-3-(2-hydroxyethyl)benzoic acid | — | — | Dispensing method | 1 | |
| Ex. 7 | 1 | 100 | Poly-p-xylylene | 70 | Tantalum oxide | Spin coating method | 1 | |
| Ex. 8 | 2 | 100 | Poly-p-xylylene | 50 | Tantalum oxide | Dispensing method | 1 | |
| Com. Ex. 1 | 1 | 150 | SiO2 | — | — | Spin coating method | 1 | |
| Com. Ex. 2 | 1 | 150 | SiO2 | — | — | Spin coating method | 5 | |
| Com. Ex. 3 | 1 | 200 | Polypropylene | — | — | Spin coating method | 1 | |
| Com. Ex. 4 | 2 | 250 | Polypropylene | — | — | Dispensing method | 1 | |

| | | | Immediately after preparation | | Allowed to stand for 20 days in dry air | | Elements |
|---|---|---|---|---|---|---|---|
| | Number of elements (pieces) | Switching characteristics observed (%) | ON/OFF ratio | ON-state current value (mode) (μA) | ON/OFF ratio | ON-state current value (mode) (μA) | having an ON-state current value of 50% or less (pieces) |
| Ex. 1 | 30 | 100 | About 1000 | 55 ± 5 | — | — | 1 |
| Ex. 2 | — | — | About 840 | About 15 | 800 | About 13 | — |
| Ex. 3 | 30 | — | About 1000 | 48 ± 7 | — | — | 0 |
| Ex. 4 | — | — | About 800 | 21 | 780 | 17 | — |
| Ex. 5 | 30 | — | About 1000 | 52 ± 10 | — | — | 1 |
| Ex. 6 | — | — | About 720 | 16 | 700 | 10 | — |
| Ex. 7 | 30 | — | About 8000 | 180 ± 18 | — | — | 0 |
| Ex. 8 | — | — | About 8700 | 21 | 8600 | 20 | — |
| Com. Ex. 1 | 30 | 40 | About 1000 | 8 ± 1 | — | — | 3 |
| Com. Ex. 2 | 30 | 90 | About 1000 | 40 ± 4 | — | — | 2 |
| Com. Ex. 3 | 30 | 53 | About 1000 | 9 ± 1 | — | — | 3 |
| Com. Ex. 4 | — | — | 750 | About 14 | 270 | 10 | — |

This application claims the right of priority based on Japanese Patent Application No. 2007-162416 filed on Jun. 20, 2007, the entire disclosure of which is incorporated herein by reference.

Hereinbefore, the present invention has been described with reference to the exemplary embodiment (and Examples), but the present invention is not limited to the exemplary embodiment (and Examples) described above. Various modifications which those skilled in the art can understand can be made to the constitution and details of the present invention within the scope of the present invention.

The invention claimed is:

1. A switching element comprising, on a supporting substrate, a source electrode and a drain electrode separated from each other, an active layer in contact with both of the electrodes, and a gate electrode separated from the two types of electrodes and in contact with the active layer via a gate insulating film,
characterized in that the active layer is formed of a carbon nanotube dispersed film, and the gate insulating film contains a layer formed of a nonconjugated polymer comprising the main chain represented by general formula [1]:

[Formula 1]

[1]

wherein Ar represents an aromatic group; X represents a linking group selected from an oxygen atom, an ester bond, and an amide bond; A represents a substituted or unsubstituted alkylene or alkyleneoxy group having 2 to 8 carbon atoms; and n represents a positive integer.

2. The switching element according to claim 1, characterized in that the carbon nanotube dispersed film is a film formed by applying a dispersion in which a carbon nanotube is dispersed in a liquid dispersion medium and then removing the dispersion medium.

3. The switching element according to claim 1, characterized in that the gate insulating film has a thickness of from 0.01 to 1 μm.

4. The switching element according to claim 1, characterized in that the gate insulating film is a film formed by applying a solution of the nonconjugated polymer material and then removing a solvent.

5. The switching element according to claim 1, characterized in that the gate insulating film is a single layer film comprising the nonconjugated polymer material.

6. The switching element according to claim 1, characterized in that Ar of the nonconjugated polymer represented by general formula [1] is an aromatic carbon ring.

7. A switching element comprising, on a supporting substrate, a source electrode and a drain electrode separated from each other, an active layer in contact with contact with both of the electrodes, and a gate electrode separated from the two types of electrodes and in contact with the active layer via a gate insulating film,
characterized in that the active layer is formed of a carbon nanotube dispersed film, and the gate insulating film contains a layer formed of a nonconjugated polymer comprising the main chain represented by general formula [2]:

Formula 2

[2]

wherein Ar represents an aromatic group; X represents a linking group selected from a single bond, an oxygen atom, an ester bond, and an amide bond; A represents a substituted or unsubstituted alkylene or alkyleneoxy group having 2 to 8 carbon atoms; and n represents a positive integer, and
wherein the gate insulating film is a laminated film of a first gate insulating film comprising at least the nonconjugated polymer material and in contact with the active layer and a second gate insulating film formed of a material different from the material of the first gate insulating film.

* * * * *